United States Patent
Chang et al.

(10) Patent No.: US 9,188,628 B2
(45) Date of Patent: Nov. 17, 2015

(54) LOAD APPARATUS FOR TESTING

(71) Applicant: Wistron Corporation, New Taipei (TW)

(72) Inventors: Kung-Hao Chang, New Taipei (TW);
Chih-Hao Chang, New Taipei (TW);
Kun-Liang Lai, New Taipei (TW)

(73) Assignee: Wistron Corporation, New Taipei (TW)

( * ) Notice: Subject to any disclaimer, the term of this patent is extended or adjusted under 35 U.S.C. 154(b) by 53 days.

(21) Appl. No.: 14/146,013

(22) Filed: Jan. 2, 2014

(65) Prior Publication Data
US 2015/0097573 A1    Apr. 9, 2015

(30) Foreign Application Priority Data
Oct. 8, 2013    (TW) ............................. 102136409 A

(51) Int. Cl.
*G01R 31/02*    (2006.01)
*G01R 31/28*    (2006.01)
*G01R 19/165*    (2006.01)

(52) U.S. Cl.
CPC ............ *G01R 31/28* (2013.01); *G01R 31/2841* (2013.01); *G01R 19/16566* (2013.01)

(58) Field of Classification Search
CPC ........ G01R 17/00; G01R 31/28; G01R 31/26; G01R 31/2805; G01R 31/024; G01R 31/2812; G01R 31/2841; G01R 31/2635; G01R 31/44; G01R 31/2884; G01R 31/2893; G01R 31/32; G01J 1/0223; G01J 1/0252; G01J 1/0425; G01J 1/4257; G01J 2001/4252; G01J 2001/4257
USPC ............... 324/537, 522, 762.07, 414, 750.01, 324/756.01, 753
See application file for complete search history.

(56) References Cited

U.S. PATENT DOCUMENTS 5,892,647 A     4/1999  Mizoe
7,291,813 B1 *  11/2007 Huang et al. .................. 219/490
(Continued)

FOREIGN PATENT DOCUMENTS

CN      101656414      2/2010
CN      102735912      10/2012

OTHER PUBLICATIONS

"Office Action of Taiwan Counterpart Application", issued on Dec. 16, 2014, with English translation thereof, p. 1-p. 9, in which the listed references were cited.

*Primary Examiner* — Minh N Tang
*Assistant Examiner* — Thang Le
(74) *Attorney, Agent, or Firm* — Jianq Chyun IP Office

(57) ABSTRACT

A load apparatus for testing is provided. The load apparatus for testing includes a first comparison circuit, a switch circuit, a voltage-dividing load circuit and a second comparison circuit. The first comparison circuit receives an input voltage from an input terminal and obtains a first sensing voltage according to the input voltage, and compares whether the first sensing voltage is greater than a first reference voltage for providing a first sensing signal. The switch circuit receives the first sensing signal and the input voltage. The switch circuit guides the input voltage to the voltage-dividing load circuit according to the first sensing signal. The voltage-dividing load circuit generates a second sensing voltage according to an input current generated at the input terminal. The second circuit is coupled to the voltage-dividing load circuit and compares whether the input current is greater than a reference current for providing a testing signal.

10 Claims, 3 Drawing Sheets

(56) References Cited

U.S. PATENT DOCUMENTS

| | | | |
|---|---|---|---|
| 9,018,845 B2* | 4/2015 | Ge et al. | 315/193 |
| 2002/0125836 A1* | 9/2002 | Chu et al. | 315/224 |
| 2005/0057179 A1* | 3/2005 | Madhani et al. | 315/185 R |
| 2007/0014159 A1* | 1/2007 | Chen et al. | 365/185.22 |
| 2008/0079467 A1* | 4/2008 | Hou | 327/143 |
| 2010/0045117 A1 | 2/2010 | Hou | |
| 2012/0262148 A1 | 10/2012 | Tu et al. | |
| 2014/0070727 A1* | 3/2014 | Pflaum | 315/307 |

* cited by examiner

LOAD APPARATUS FOR TESTING

CROSS-REFERENCE TO RELATED APPLICATION

This application claims the priority benefit of Taiwan application serial no. 102136409, filed on Oct. 8, 2013. The entirety of the above-mentioned patent application is hereby incorporated by reference herein and made a part of this specification.

BACKGROUND

1. Technical Field

The invention relates to an electronic apparatus. Particularly, the invention relates to a load apparatus for testing a light emitting diode (LED) driving circuit.

2. Related Art

Since light emitting diode (LED) has advantages of low power consumption, long service life, environmental protection and small size, etc., it is widely used in backlight modules of illumination equipment, various display equipment and various mobile electronic products. However, since physical characteristics of the LED are unique, and the LED has a so-called light declining problem after a period of use time. Therefore, a current LED driving circuit generally drives the LED through a constant current mode. In order to test whether the LED driving circuit normally operates, following methods are generally used to implement the test. A first method is to directly use an actual resistor to serve as a load of the LED driving circuit, though since an impedance characteristic of the LED is not completely the same to a linear impedance characteristic of a general resistor, an obtained testing result is not necessarily suitable for actually driving the LED. A second method is to directly use an LED light bar (i.e. a plurality of LEDs connected in series) to implement the test, if the LED driving circuit is unstable, the LED serving as the load is often burned to increase the testing cost, and different numbers and specifications of the LEDs have to be prepared for different LED driving circuits to implement the test. A third method is to use a "programmable electronic load" dedicated to the simulation test to implement testing the LED driving circuit. However, the price of the programmable electronic load dedicated for experiment and simulation is too expensive, which is a heavy burden to the manufacturer in case of extensive production testing. Therefore, an applicable and convenient testing technique is required for testing the LED driving circuit.

SUMMARY

The invention provides a load apparatus for testing, in which simple circuit elements are used to simulate an impedance characteristic of a light emitting diode (LED), so as to reduce the cost for testing an LED driving circuit.

A load apparatus for testing of the invention includes a first comparison circuit, a switch circuit, a voltage-dividing load circuit and a second comparison circuit. The first comparison circuit receives an input voltage from an input terminal and obtains a first sensing voltage according to the input voltage, and compares whether the first sensing voltage is greater than a first reference voltage for providing a first sensing signal. A control terminal of the switch circuit receives the first sensing signal, a first terminal of the switch circuit receives the input voltage, and at least one terminal of the switch circuit is coupled to the voltage-dividing load circuit. The switch circuit guides the input voltage to the voltage-dividing load circuit according to the first sensing signal. The voltage-dividing load circuit generates a second sensing voltage according to an input current generated at the input terminal and a load of the voltage-dividing load circuit. The second comparison circuit is coupled to the voltage-dividing load circuit and compares whether the input current is greater than a reference current according to the second sensing voltage, so as to provide a testing signal.

In an embodiment of the invention, the first comparison circuit includes a first voltage-dividing circuit, a second voltage-dividing circuit and a first comparator. The first voltage-dividing circuit is used for receiving the input voltage, and dividing the input voltage to generate the first sensing voltage. The second voltage-dividing circuit is used for receiving a power supply voltage and dividing the power supply voltage to generate the first reference voltage. A non-inverted input terminal of the first comparator receives the first sensing voltage, and an inverted input terminal of the first comparator receives the first reference voltage.

In an embodiment of the invention, the switch circuit includes a transistor. A control terminal of the transistor receives the first sensing signal, a first terminal of the transistor receives the input voltage, and a second terminal of the transistor is coupled to the voltage-dividing load circuit.

In an embodiment of the invention, the voltage-dividing load circuit includes a first resistor and a second resistor. A first terminal of the first resistor receives the input voltage, and a second terminal of the first resistor is coupled to the first terminal of the switch circuit.

In another embodiment of the invention, the voltage-dividing load circuit includes a first resistor and a second resistor. A first terminal of the first resistor is coupled to the first terminal of the switch circuit. A first terminal of the second resistor is coupled to a second terminal of the first resistor to serve as an output terminal of the voltage-dividing load circuit, and a second terminal of the second resistor receives a ground voltage.

In an embodiment of the invention, the second comparison circuit includes a second comparator. A non-inverted input terminal of the second comparator receives the first sensing voltage, an inverted input terminal of the second comparator receives a second reference voltage, and an output terminal of the second comparator generates the testing signal.

In an embodiment of the invention, the load apparatus for testing further includes a potential maintaining circuit. The potential maintaining circuit is coupled to an output terminal of the first comparison circuit and the control terminal of the switch circuit, and when the first sensing signal is enabled, the potential maintaining circuit maintains the first sensing signal to a high level.

In an embodiment of the invention, the load apparatus for testing further includes a test prompt circuit. The test prompt circuit is coupled to the second comparison circuit, and the test prompt circuit lights a light emitting diode in the test prompt circuit when receiving the testing signal.

According to the above descriptions, in the load apparatus for testing of the embodiment of the invention, the first comparison circuit can be used to compare whether the input voltage is greater than a preset LED forward bias. When the input voltage is greater than the preset LED forward bias, the switch circuit is used to guide the input voltage to the voltage-dividing load circuit, so as to detect the input current provided at the terminal of the input voltage. Then, the second comparison circuit is used to compare a preset voltage value with the second sensing voltage generated through the voltage-dividing load circuit and the input current, so as to determine whether the input current is complied with a preset current value, and accordingly generate the testing signal for testing whether a function of the LED driving circuit is normal. In this way, the load apparatus for testing may use simple circuit elements to simulate an impedance characteristic of the LED, so as to reduce the cost for testing the LED driving circuit.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION OF DISCLOSED EMBODIMENTS

Figure 1:
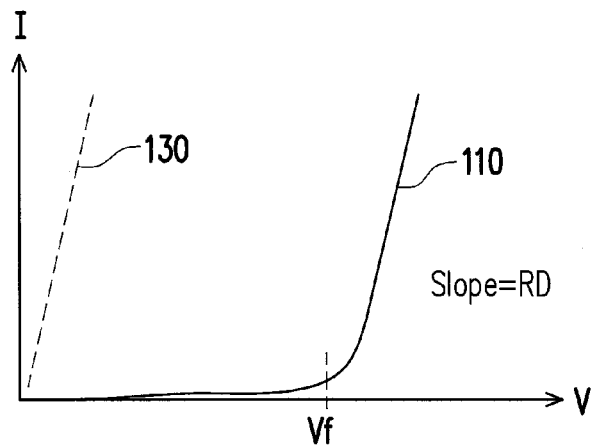
FIG. 1 is a current-voltage (I-V) characteristic curve diagram of a light emitting diode (LED).

A current-voltage relationship of a general light emitting diode (LED) is first described. Generally, an equivalent circuit of the LED can be composed of a resistor and a positive battery connected in series to the resistor. Here, it is assumed that the resistor in the equivalent circuit of the LED has a resistance value RD, and the positive battery has a forward bias Vf. FIG. 1 is a current-voltage (I-V) characteristic curve diagram of the LED. When a voltage exerted to the LED is smaller than the forward bias Vf of the positive battery in the equivalent circuit of the LED, the current of the LED approaches to zero, and the LED is not turned on. On the other hand, when the voltage exerted to the LED is greater than the forward bias Vf of the positive battery in the equivalent circuit of the LED, the LED is turned on, and presents a linear curve 110 with a slope of RD. Therefore, when a function of an LED driving circuit is tested, if only the resistor is taken as the load without considering the forward bias in the equivalent circuit, the I-V characteristic curve in FIG. 1 may present a characteristic of a straight line 130, which is obviously not complied with the real I-V characteristic curve, so that the function of the LED driving circuit cannot be tested. Therefore, the real characteristic of the LED cannot be simulated by only using the resistor to serve as the load.

According to the characteristic curve 110 of the LED of FIG. 1, when it is required to test whether the LED driving circuit normally operates, the test can be implemented in two stages. In the first stage, it is first determined whether a voltage provided by the LED driving circuit reaches the forward bias Vf of the positive battery in the equivalent circuit of the LED. When the voltage provided by the LED driving circuit reaches the forward bias Vf of the positive battery in the equivalent circuit of the LED, in the second stage, it is further confirmed whether a current generated by the LED driving circuit reaches a current value required by the LED. In this way, in the embodiment of the invention, the simple circuit elements can be used to implement the aforementioned impedance characteristic, and accordingly generate a corresponding testing signal to determine whether a tested object normally operates, so as to save the cost.

Figure 2:
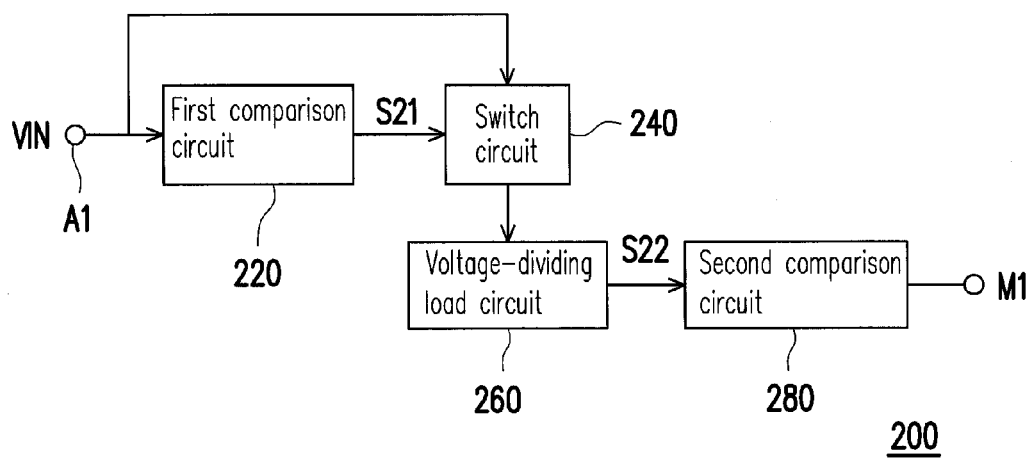
FIG. 2 is a block diagram of a load apparatus for testing according to an embodiment of the invention.

FIG. 2 is a block diagram of a load apparatus for testing 200 according to an embodiment of the invention. The load apparatus for testing 200 includes a first comparison circuit 220, a switch circuit 240, a voltage-dividing load circuit 260 and a second comparison circuit 280. The load apparatus for testing 200 can be designed as a load apparatus for testing a constant current device (for example, the LED driving circuit). When the load apparatus for testing 200 is coupled to the LED driving circuit, a tester can test whether the function of the LED driving circuit is normal by using the load apparatus for testing 200.

The first comparison circuit 220 receives an input voltage VIN provided by the LED driving circuit from an input terminal A1 and obtains a first sensing voltage according to the input voltage VIN, and compares voltage of the first sensing voltage and a first reference voltage. In the present embodiment, the first reference voltage is determined according to the forward bias Vf in FIG. 1. The first comparison circuit 220 compares whether the first sensing voltage is greater than the first reference voltage, so as to provide a first sensing signal S21. For example, when the first sensing voltage is greater than the first reference voltage, the first comparison circuit 220 outputs the first sensing signal S21 (for example, a signal with a logic value of 1). In the present embodiment, the first comparison circuit 220 can be implemented by an operational amplifier circuit or other circuits having a comparison function. On the other hand, the first sensing voltage can be the input voltage VIN, though the invention is not limited thereto. In other embodiments, the first sensing voltage can be adjusted according to the input voltage VIN, which is described later. The first reference voltage can be preset in the first comparison circuit 220. Besides, the first comparison circuit 220 may also receive the first reference voltage from external. Referring to FIG. 1, the load apparatus for testing 200 performs a functional testing of the first stage of the LED driving circuit by using the first comparison circuit 220. When the input voltage VIN provided by the LED driving circuit is greater than the first reference voltage, it represents that the LED driving circuit passes through the testing of the first stage, and testing of the second stage can be performed.

A control terminal of the switch circuit 240 is coupled to the first comparison circuit 220 for receiving the first sensing signal S21, a first terminal of the switch circuit 240 receives the input voltage VIN, and at least one terminal of the switch circuit 240 is coupled to the voltage-dividing load circuit 260. In the present embodiment, the switch circuit 240 can be a transistor or other electronic element having a switch function. On the other hand, in the present embodiment, the switch circuit 240 is set to be turned on when receiving the first sensing signal S21 of a high level (for example, a signal with logic value of 1), though the invention is not limited thereto. In other embodiments, the switch circuit 240 of the load apparatus for testing 200 may have different turn-on settings. For example, the switch circuit 240 of the load apparatus for testing 200 is set to be turned on when receiving the first sensing signal S21 of a low level (for example, a signal with logic value of 0).

The switch circuit 240 guides the input voltage VIN to the voltage-dividing load circuit 260 according to the first sensing signal S21. For example, when the switch circuit 240 receives the first sensing signal S21 with the logic value of 1, the switch circuit 240 is turned on, and the input voltage VIN is transmitted to the voltage-dividing load circuit 260 through the switch circuit 240. Then, the voltage-dividing load circuit 260 generates a second sensing voltage S22 according to an input current generated at the input terminal A1 and a load of the voltage-dividing load circuit 260. Implementation of the load of the voltage-dividing load circuit 260 is described later. The second comparison circuit 280 is coupled to the voltage-dividing load circuit 260 for receiving the second sensing voltage S22, and the second comparison circuit 280 compares the second sensing voltage S22 with a second reference voltage. The second comparison circuit 280 compares whether the second sensing voltage S22 is greater than the second reference voltage and provides a testing signal M1. It should be noticed that the second sensing voltage S22 includes information of the input current generated at the input terminal A1. On the other hand, the load apparatus for testing 200 may preset a reference current, and information of the reference current is included in the second reference voltage. According to another aspect, the second comparison circuit 280 determines whether the input current generated at the input terminal A1 is greater than the preset reference current according to the second sensing voltage S22, so as to provide the testing signal M1.

The testing signal M1 can be a voltage, a current, a logic signal or other electronic signals. For example, when the second sensing voltage S22 is greater than the second reference voltage, the second comparison circuit 280 outputs the testing signal M1 (for example, a signal with logic value of 1). Implementation of the second comparison circuit 280 is similar to that of the first comparison circuit 220, which is not repeated. Besides, the second reference voltage can be preset in the second comparison circuit 280, though the invention is not limited thereto, and the second comparison circuit 280 may also receive the second reference voltage from external. In the present embodiment, the first reference voltage can be equal to the second reference voltage, and in other embodiments, the load apparatus for testing 200 may also set the first reference voltage and the second reference voltage to different voltage values according to an actual requirement.

Referring to FIG. 1, it is known that the load apparatus for testing 200 performs a functional testing of the second stage of the LED driving circuit by using the second comparison circuit 280. When the second sensing voltage S22 is greater than the second reference voltage, it represents that the current generated by the LED driving circuit reaches a current value required by the LED, and the tester determines that the function of the LED driving circuit is normal according to the testing signal M1 with logic value of 1. On the other hand, when the second sensing voltage S22 is smaller than or equal to the second reference voltage, it represents that the current generated by the LED driving circuit does not reach the current value required by the LED. Now, the second comparison circuit 280 outputs a signal having an opposite significance with that of the testing signal M1 (for example, a signal with logic value of 0), and the tester determines that the function of the LED driving circuit is probably abnormal. It should be noticed that in FIG. 1, the second stage is to test the current generated by the LED driving circuit. However, the second comparison circuit 280 compares voltages values of the second sensing voltage S22 and the second reference voltage. This is because that the voltage-dividing load circuit 260 located in a previous stage of the second comparison circuit 280 has converted the current generated by the LED driving circuit into the second sensing voltage S22, and a detailed implementation thereof is described later.

Figure 3:
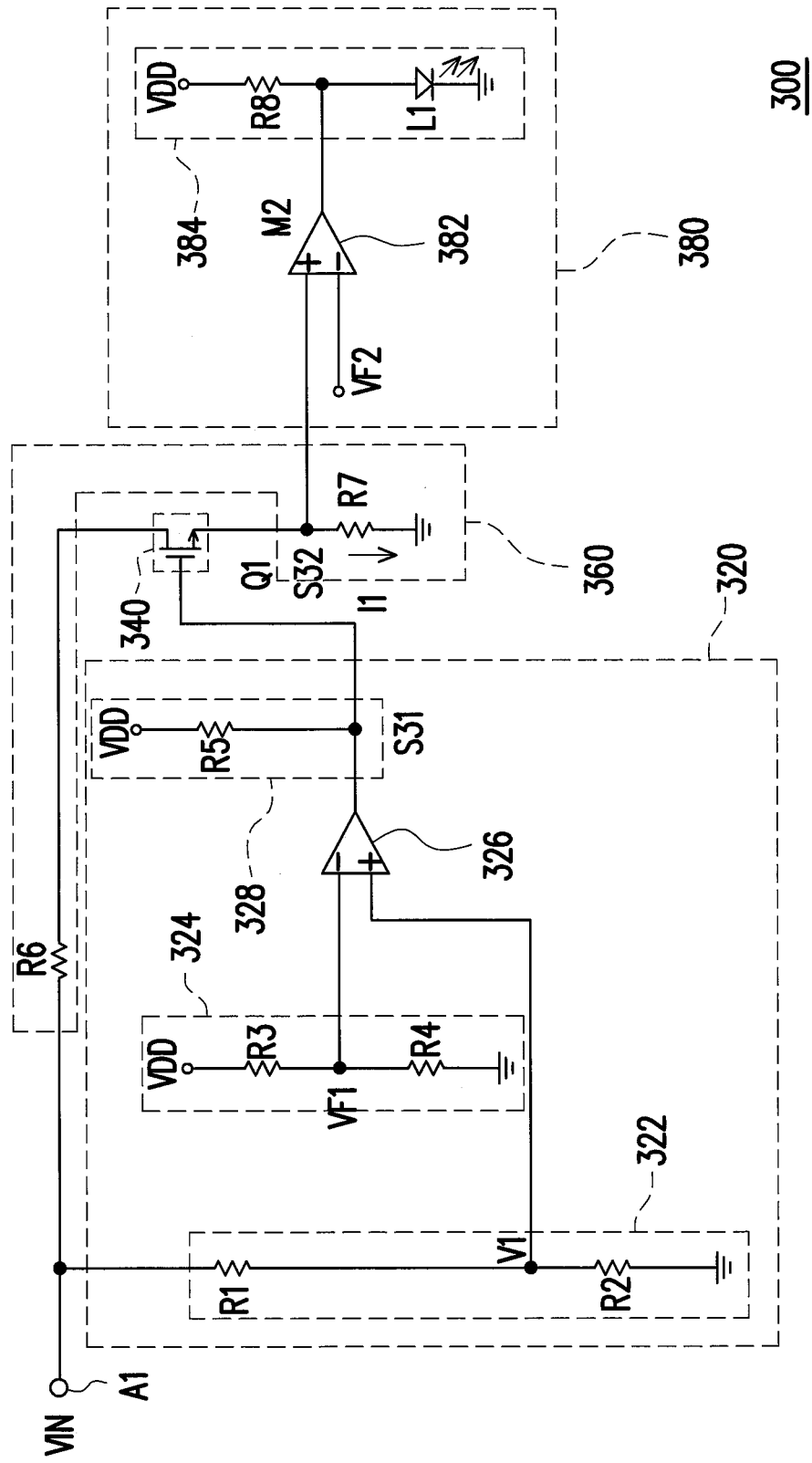
FIG. 3 is a circuit diagram of a load apparatus for testing according to an embodiment of the invention.

Implementation of another kind of load apparatus for testing of the invention is provided below. FIG. 3 is a circuit diagram of a load apparatus for testing 300 according to an embodiment of the invention. The load apparatus for testing 300 includes a first comparison circuit 320, a switch circuit 340, a voltage-dividing circuit 360 and a second comparison circuit 380. The switch circuit 340 is coupled to the first comparison circuit 320 and the voltage-dividing load circuit 360, and the second comparison circuit 380 is coupled to the voltage-dividing load circuit 360. Implementation of the load apparatus for testing 200 of FIG. 2 can be deduced according to related descriptions of the load apparatus for testing 300 of FIG. 3. For example, the first comparison circuit 320 in FIG. 3 can be regarded as a circuit schematic diagram of the first comparison circuit 220 of FIG. 2, the switch circuit 340 in FIG. 3 can be regarded as a circuit schematic diagram of the switch circuit 240 of FIG. 2, the voltage-dividing load circuit 360 in FIG. 3 can be regarded as a circuit schematic diagram of the voltage-dividing load circuit 260 of FIG. 2, and the second comparison circuit 380 in FIG. 3 can be regarded as a circuit schematic diagram of the second comparison circuit 280 of FIG. 2.

The first comparator circuit 320 includes a first voltage-dividing circuit 322, a second voltage-dividing circuit 324, a first comparator 326 and a potential maintaining circuit 328. The first voltage-dividing circuit 322 includes a resistor R1 and a resistor R2. A first terminal of the resistor R1 receives the input voltage VIN from the input terminal A1, a second terminal of the resistor R1 is coupled to a first terminal of the resistor R2, and a second terminal of the resistor R2 is coupled to ground. When the first voltage-dividing circuit 322 receives the input voltage VIN, the resistor R1 and the resistor R2 divide the input voltage VIN to generate a first sensing voltage V1. The first voltage-dividing circuit 322 is configured in the load apparatus for testing 300 in order to avoid influencing a follow-up circuit when the input voltage VIN is too large. The second voltage-dividing circuit 324 includes a resistor R3 and a resistor R4 coupled to a power supply voltage VDD. A first terminal of the resistor R3 receives the power supply voltage VDD, a second terminal of the resistor R3 is coupled to a first terminal of the resistor R4, and a second terminal of the resistor R4 is coupled to the ground. The second voltage-dividing circuit 324 divides a voltage of the power supply voltage VDD through the resistor R3 and the resistor R4 to generate a first reference voltage VF1. The second voltage-dividing circuit 324 is configured in the load apparatus for testing 300 in order to adjust the first reference voltage VF1. The first reference voltage VF1 can be determined according to the power supply voltage VDD and resistance values of the resistor R3 and the resistor R4. In other embodiments of the invention, the first voltage-dividing circuit 322 and the second voltage-dividing circuit 324 can be implemented by connecting a plurality of resistors in series or parallel, or implemented through variable resistors or other elements.

In the present embodiment, the first comparator 326 is implemented by an operational amplifier, a non-inverted input terminal and an inverted input terminal of the first comparator 326 respectively receive the first sensing voltage V1 and the first reference voltage VF1. Then, the first comparator 326 compares voltage values of the first sensing voltage V1 and the first reference voltage VF1. When the first sensing voltage V1 is greater than the first reference voltage VF1, the first comparator 326 outputs a first sensing signal S31 through an output terminal. According to another aspect, when the voltage value of the first sensing voltage V1 is greater than the voltage value of the first reference voltage VF1, the first sensing signal S31 output though the output terminal of the first comparator 326 is enabled. On the other hand, when the voltage value of the first sensing voltage V1 is smaller than or equal to the voltage value of the first reference voltage VF1, the first sensing signal S31 output by the first comparator 326 is disabled. For example, when the first sensing voltage V1 is 3 volts, and the first reference voltage VF1 is 2 volts, the first comparator 326 outputs the first sensing signal S31 with a logic value of 1. On the other hand, when the first sensing voltage V1 is 2 volts, and the first reference voltage VF1 is 3 volts, the first comparator 326 outputs the first sensing signal S31 with the logic value of 0.

On the other hand, in the load apparatus for testing 300, the potential maintaining circuit 328 can be configured between the output terminal of the first comparator 326 and the control terminal of the switch circuit 340, and the potential maintaining circuit 328 includes a resistor R5 coupled to the power supply voltage VDD. When the first sensing signal S31 output by the first comparator 326 is enabled (for example, a signal with a logic value of 1), the potential maintaining circuit 328 may maintain a level of the first sensing signal S31 to a high level (for example, with a logic value of 1) though the power supply voltage VDD and the resistor R5. In the present embodiment, the switch circuit 340 is designed to turn on in response to the first sensing signal S31 of the high level. Therefore, the potential maintaining circuit 328 can maintain the first sensing signal S31 to the high level after the switch circuit 340 receives the enabled first sensing signal S31, such that the switch circuit 340 is maintained to be turned on to facilitate operation of the follow-up circuit.

In the present embodiment, the switch circuit 340 is implemented by the transistor Q1, though the invention is not limited thereto, and any electronic element having a switch function can be used to implement the switch circuit 340. A control terminal of the transistor Q1 is coupled to the output terminal of the first comparator 326 for receiving the first sensing signal S31. On the other hand, the voltage-dividing load circuit 360 includes a first resistor R6 and a second resistor R7, wherein a first terminal of the first resistor R6 is coupled to the input terminal A1 for receiving the input voltage VIN, a second terminal of the first resistor R6 is coupled to a first terminal of the transistor Q1, a first terminal of the second resistor R7 receives the ground voltage, and a second terminal of the second resistor R7 is coupled to a second terminal of the transistor Q1 to serve as an output terminal of the voltage-dividing load circuit 360. When the transistor Q1 is turned on, the input voltage VIN is transmitted to the second resistor R7 through the first resistor R6 and the transistor Q1, and the voltage-dividing load circuit 360 generates a second sensing voltage S32 according to the input current generated at the input terminal A1, the first resistor R6 and the second resistor R7.

Then, a second comparator 382 in the second comparison circuit 380 respectively receives the second sensing voltage S32 and a second reference voltage VF2 through a non-inverted input terminal and an inverted input terminal thereof. The second comparator 382 compares voltage values of the second sensing voltage S32 and the second reference voltage VF2, and when the second sensing voltage S32 is greater than the second reference voltage VF2, the second comparator 382 outputs a testing signal M2 through an output terminal thereof. In the present embodiment, the second comparator 382 is similar to the first comparator 326, and is also implemented by an operational amplifier, though the invention is not limited thereto, and any circuit having the comparison function can be used to implement the first comparator 326 and the second comparator 382. In the present embodiment, the test can determine whether the function of the LED driving circuit is normal according to the testing signal M2 outputs by the second comparator 382. For example, when the function of the LED driving circuit is normal, the second comparator 382 outputs the testing signal M2 with a logic value of 1. In another embodiment, when the LED driving circuit cannot normally operate, the second comparator 382 may output the testing signal M2 with a logic value of 0.

It should be noticed that the first resistor R6 and the second resistor R7 in the voltage-dividing load circuit 360 can convert the input voltage VIN provided by the LED driving circuit into a current form. For example, a current I1 flowing through the second resistor R7 represents a part of input current provided by the LED driving circuit. Therefore, although the second comparator 382 compares the voltage values of the second sensing voltage S32 and the second reference voltage VF2, the second sensing voltage S32 includes the current information provided by the LED driving circuit. On the other hand, the load apparatus for testing 300 may preset a reference current, and information of the reference current is included in the second reference voltage VF2. Therefore, the second comparison circuit 380 may test whether the current provided by the LED driving circuit is greater than the preset reference current. Besides, the first resistor R6 is configured in front of the switch circuit 360 for receiving the input voltage VIN, and according to such circuit design, the load apparatus for testing 300 may adjust the current received from the LED driving circuit to cope with different testing situations.

A test prompt circuit 384 can be configured in the second comparison circuit 380 to receive the testing signal M2 output by the second comparator 382. The test prompt circuit 384 is coupled to the output terminal of the second comparator 382, and the test program circuit 384 includes a third resistor R8 coupled to the power supply voltage VDD and a light emitting diode (LED) L1. A first terminal of the third resistor R8 is coupled to the power supply voltage VDD, and a second terminal of the third resistor R8 is coupled to the output terminal of the second comparator 382 and the LED L1. The test prompt circuit 384 is another basis according which the tester determines whether the function of the LED driving circuit is normal. For example, when the function of the LED driving circuit is normal, the second comparator 382 outputs the testing signal M2 with a logic value of 1, and now the LED L1 is lighted. On the other hand, when the function of the LED driving circuit is abnormal, the second comparator 382 outputs the testing signal M2 with a logic value of 0, and now the LED L1 is not lighted. Therefore, the tester can determine whether the function of the LED driving circuit is normal according to whether the LED L1 is lighted. In the present embodiment, the LED L1 can be an LED array or other load element. In other embodiments, the output terminal of the second comparator 382 can be coupled to a computer or a server used for testing, or other apparatus having a signal receiving function, and the test prompt circuit 384 can be a test program built in the above apparatus. The test prompt circuit 384 receives the testing signal M2 to determine whether the function of the LED driving circuit is normal.

Figure 4:
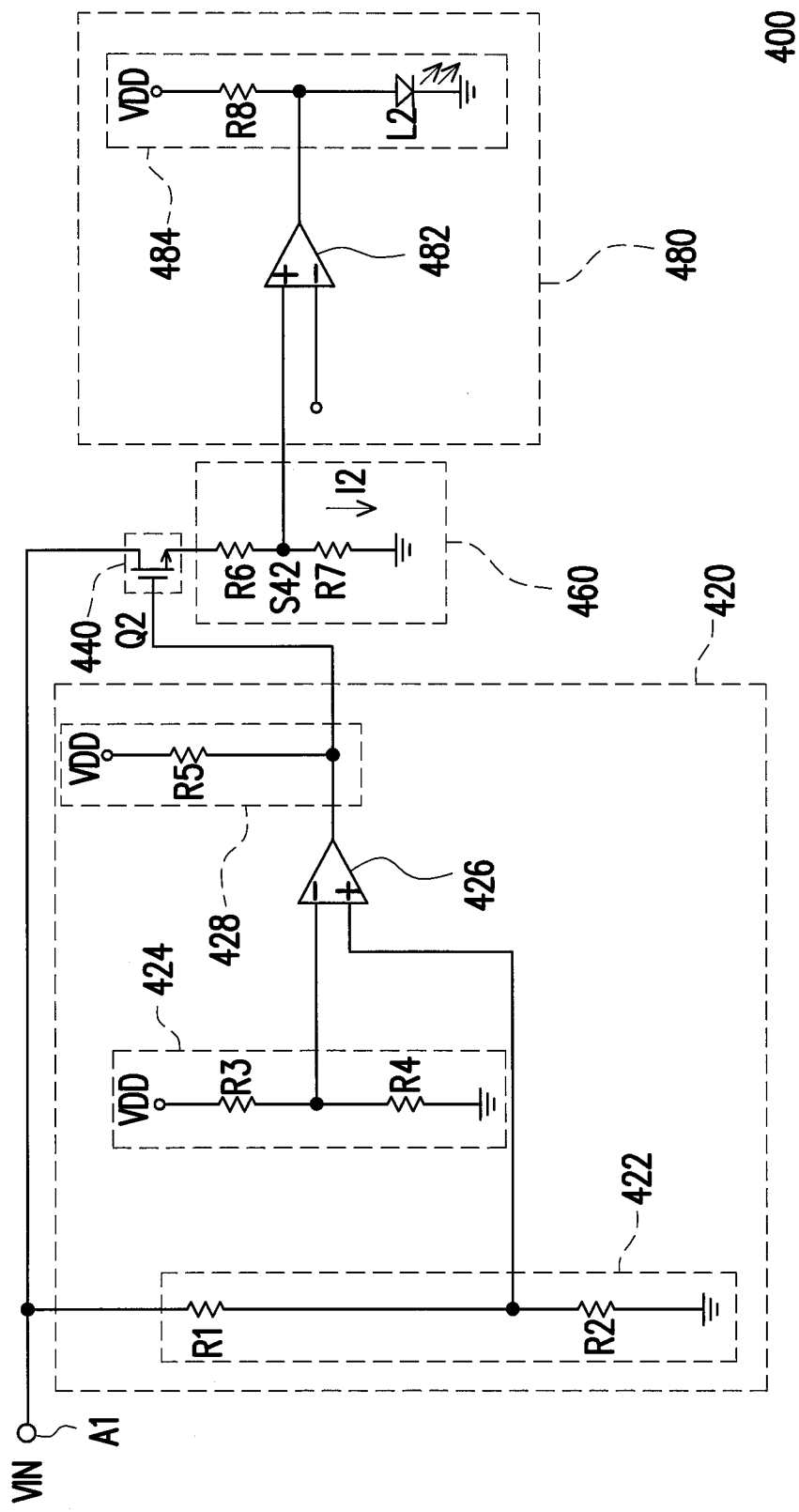
FIG. 4 is a circuit diagram of a load apparatus for testing according to another embodiment of the invention.

FIG. 4 is a circuit diagram of a load apparatus for testing 400 according to another embodiment of the invention. The load apparatus for testing 400 includes a first comparison circuit 420, a switch circuit 440, a voltage-dividing load circuit 460 and a second comparison circuit 480. A part of the elements in FIG. 4 have been described in the embodiment of FIG. 3, and are not repeated. Referring to FIG. 3 and FIG. 4, a difference there between lies in a configuration method of the resistors in the voltage-dividing load circuit 360 and the voltage-dividing load circuit 460. In FIG. 3, the first resistor R6 and the second resistor R7 in the voltage-dividing load circuit 360 are respectively coupled to the first terminal and the second terminal of the switch circuit 340. When the switch circuit 340 is turned on, the input voltage VIN is divided by the first resistor R6 and the second resistor R7 to generate the second sensing voltage S32. However, in FIG. 4, the first terminal of the first resistor R6 in the voltage-dividing load circuit 460 is coupled to the first terminal of the switch circuit 440, the first terminal of the second resistor R7 is coupled to the second terminal of the first resistor R6 to serve as the output terminal of the voltage-dividing load circuit 460, and the second terminal of the second resistor R7 receives the ground voltage. When the switch circuit 440 is turned on, the first terminal of the switch circuit 440 receives the input voltage VIN from the input terminal A1 and guides the input voltage YIN to the voltage-dividing load circuit 460. The input voltage YIN is divided by the first resistor R6 and the second resistor R7 to generate a second sensing voltage S42. On the other hand, a current I2 flowing through the second resistor R7 includes information of the input current generated at the input terminal A1. The second comparison circuit 480 compares whether the input current generated at the input terminal A1 is greater than the preset reference current according to the second sensing voltage S42, so as to determine whether the function of the LED driving circuit is normal. After receiving the second sensing voltage S42, the operation of the second comparison circuit 480 is the same to that of the second comparison circuit 380, which is not repeated.

According to the above descriptions, it is known that when the load apparatus for testing 300 is coupled to the LED driving circuit, the switch circuit 340 receives a part of current provided by the LED driving circuit, and the part of current is converted into voltage information through the voltage-dividing load circuit 360. On the other hand, when the load apparatus for testing 400 is coupled to the LED driving circuit, based on a configuration method of the switch circuit 440 and the voltage-dividing load circuit 460, the switch circuit 440 receives all of the current provided by the LED driving circuit, and the current is converted into voltage information through the voltage-dividing load circuit 460. The tester can select one of the above two implementations according to an actual testing requirement.

In summary, in the load apparatus for testing of the embodiment of the invention, the first comparison circuit can be used to compare whether the input voltage is greater than a preset LED forward bias. When the input voltage is greater than the preset LED forward bias, the switch circuit guides the input voltage to the voltage-dividing load circuit, so as to detect the input current provided at the terminal of the input voltage. Then, the second comparison circuit is used to compare a preset voltage value with the second sensing voltage generated through the voltage-dividing load circuit and the input current, so as to determine whether the input current is complied with a preset current value, and accordingly generate the testing signal for testing whether the function of the LED driving circuit is normal. In this way, the load apparatus for testing may use simple circuit elements to simulate an impedance characteristic of the LED, so as to reduce the cost for testing the LED driving circuit.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:
1. A load apparatus for testing an LED driving circuit, comprising:

a first comparison circuit, receiving an input voltage provided by the LED driving circuit from an input terminal and obtaining a first sensing voltage according to the input voltage, and comparing whether the first sensing voltage is greater than a first reference voltage for providing a first sensing signal to determine whether the input voltage is greater than a forward bias of an LED;

a switch circuit and a voltage-dividing load circuit, wherein a control terminal of the switch circuit receives the first sensing signal, a first terminal of the switch circuit receives the input voltage, and at least one terminal of the switch circuit is coupled to the voltage-dividing load circuit, the switch circuit guides the input voltage to the voltage-dividing load circuit according to the first sensing signal, and the voltage-dividing load circuit generates a second sensing voltage according to an input current generated at the input terminal and a load of the voltage-dividing load circuit; and a second comparison circuit, coupled to the voltage-dividing load circuit, and comparing whether the input current is greater than a reference current according to the second sensing voltage to determine whether the input current complies with a preset current value, so as to provide a testing signal.

2. The load apparatus for testing as claimed in claim 1, wherein the first comparison circuit comprises:
a first voltage-dividing circuit, receiving the input voltage, and dividing the input voltage to generate the first sensing voltage;
a second voltage-dividing circuit, receiving a power supply voltage, and dividing the power supply voltage to generate the first reference voltage; and
a first comparator, a non-inverted input terminal of the first comparator receiving the first sensing voltage, and an inverted input terminal of the first comparator receiving the first reference voltage.

3. The load apparatus for testing as claimed in claim 1, wherein the switch circuit comprises:
a transistor, a control terminal of the transistor receiving the first sensing signal, a first terminal of the transistor receiving the input voltage, and a second terminal of the transistor coupled to the voltage-dividing load circuit.

4. The load apparatus for testing as claimed in claim 1, wherein the voltage-dividing load circuit comprises:
a first resistor, a first terminal of the first resistor receiving the input voltage and a second terminal of the first resistor coupled to the first terminal of the switch circuit; and
a second resistor, a first terminal of the second resistor receiving a ground voltage, and a second terminal of the second resistor coupled to a second terminal of the switch circuit to serve as an output terminal of the voltage-dividing load circuit.

5. The load apparatus for testing as claimed in claim 1, wherein the voltage-dividing load circuit comprises:
a first resistor, a first terminal of the first resistor coupled to the first terminal of the switch circuit; and
a second resistor, a first terminal of the second resistor coupled to a second terminal of the first resistor to serve as an output terminal of the voltage-dividing load circuit, and a second terminal of the second resistor receiving a ground voltage.

6. The load apparatus for testing as claimed in claim 1, wherein the second comparison circuit comprises:
a second comparator, a non-inverted input terminal of the second comparator receiving the second sensing voltage, an inverted input terminal of the second comparator receiving a second reference voltage, and an output terminal of the second comparator generating the testing signal.

7. The load apparatus for testing as claimed in claim 6, wherein the second reference voltage is equal to the first reference voltage.

8. The load apparatus for testing as claimed in claim 1, further comprising:
a potential maintaining circuit, coupled to an output terminal of the first comparison circuit and the control terminal of the switch circuit, wherein when the first sensing signal is enabled, the potential maintaining circuit maintains the first sensing signal to a high level.

9. The load apparatus for testing as claimed in claim 1, further comprising:
a test prompt circuit, coupled to the second comparison circuit, and the test prompt circuit lights a light emitting diode when receiving the testing signal.

10. The load apparatus for testing as claimed in claim 9, wherein the test prompt circuit comprises:
a third resistor, a first terminal of the third resistor receiving a power supply voltage, and a second terminal of the third resistor coupled to an output terminal of the second comparison circuit; and
the light emitting diode, coupled between the output terminal of the second comparison circuit and the ground voltage.

* * * * *